United States Patent [19]
Blankenship et al.

[11] Patent Number: 5,838,606
[45] Date of Patent: Nov. 17, 1998

[54] THREE-TRANSISTOR STATIC STORAGE CELL

[75] Inventors: Dennis Blankenship; Stephen Mann, both of Durham, N.C.

[73] Assignee: Mitsubishi Semiconductor America, Inc., Durham, N.C.

[21] Appl. No.: 845,840

[22] Filed: Apr. 28, 1997

[51] Int. Cl.6 .................................................. G11C 11/00
[52] U.S. Cl. .......................................... 365/156; 365/154
[58] Field of Search ...................... 365/156, 154

[56] References Cited

U.S. PATENT DOCUMENTS

| | | | |
|---|---|---|---|
| 4,885,719 | 12/1989 | Brahmbhatt | 365/181 |
| 4,958,317 | 9/1990 | Terada et al. | 365/104 |
| 5,128,731 | 7/1992 | Lien et al. | 357/23.5 |
| 5,251,169 | 10/1993 | Josephson | 365/72 |
| 5,278,459 | 1/1994 | Matsui et al. | 307/291 |
| 5,293,055 | 3/1994 | Hara et al. | 257/296 |
| 5,301,147 | 4/1994 | Guo et al. | 365/154 |
| 5,329,487 | 7/1994 | Gupta et al. | 365/185 |
| 5,367,482 | 11/1994 | Guo et al. | 365/156 |
| 5,388,067 | 2/1995 | Sato et al. | 365/154 |
| 5,398,207 | 3/1995 | Tsuchida et al. | 365/226 |
| 5,400,278 | 3/1995 | Kunori et al. | 365/182 |
| 5,404,328 | 4/1995 | Takemae | 365/185 |
| 5,420,818 | 5/1995 | Svejda et al. | 365/104 |
| 5,428,238 | 6/1995 | Hayashi et al. | 257/366 |
| 5,428,571 | 6/1995 | Atsumi et al. | 365/189.05 |
| 5,438,537 | 8/1995 | Sasaki | 365/154 |
| 5,438,542 | 8/1995 | Atsumi et al. | 365/182 |
| 5,473,562 | 12/1995 | Liu | 365/154 |
| 5,640,342 | 6/1997 | Gonzalez | 365/156 |

*Primary Examiner*—David C. Nelms
*Assistant Examiner*—Hien Nguyen
*Attorney, Agent, or Firm*—McDermott, Will & Emery

[57] ABSTRACT

A SRAM storage cell has a NMOS transistor and a PMOS transistor connected with each other between a source of potential and ground. The sources, gates and gate back plates of the transistors are commonly connected and coupled to a storage node. The drain of the NMOS transistor is supplied with the potential, whereas the drain of the PMOS transistor is grounded. A pass NMOS transistor is connected between the storage node and bit and word lines. This storage cell configuration provides considerably reduced area compared to conventional static storage cells.

12 Claims, 5 Drawing Sheets

Three Transistor Static Storage Cell

Three Transistor Static Storage Cell

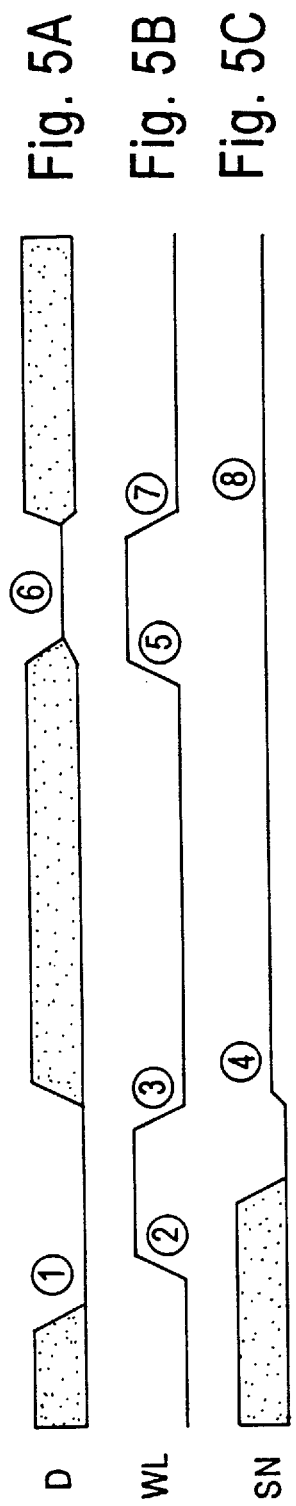
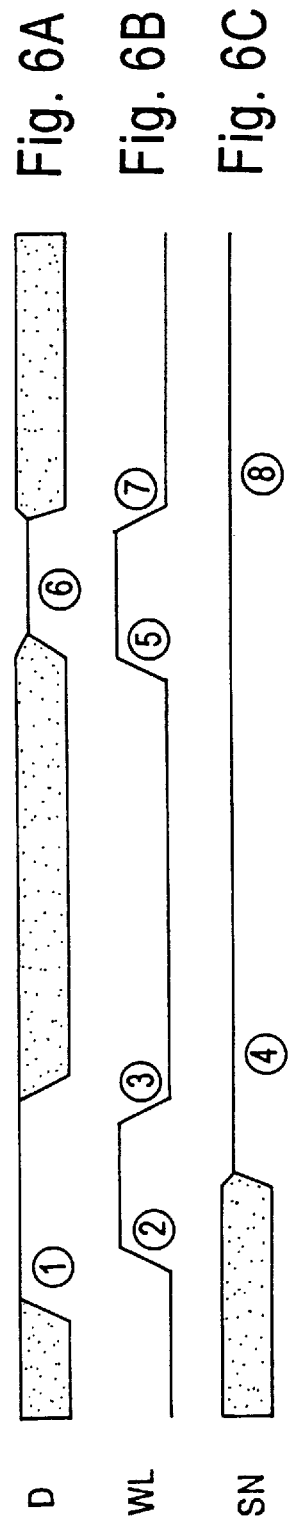

THREE-TRANSISTOR STATIC STORAGE CELL

TECHNICAL FIELD

The present invention relates to static random access memory (SRAM) devices, and more particularly, to a storage cell for the SRAM devices.

BACKGROUND ART

Metal oxide semiconductor (MOS) components are used to provide random access memory (RAM) devices operating in a static mode. These static RAM (SRAM) devices are typically implemented as a 4-transistor cell having two resistors or as a 6-transistor cell. An example of a 4-transistor SRAM cell is shown in FIG. 1A, with MOS transistors Q1 and Q4 which provide the gating or addressing of the SRAM cell and MOS transistors Q2 and Q3 in combination with load resistors R1 and R2 which form a bistable unit for storing a digital value. To read data from the SRAM cell in FIG. 1A, an address signal is supplied to set the gates of Q1 and Q4 to $V_{dd}$ (logic "1" for NMOS). If a "1" is stored in the SRAM cell, then Q3 is on and Q2 is off so that node N2 is at 0 volt and node N1 is at $V_{dd}$. In order to write a "1" into the SRAM cell, an address signal is supplied that sets the gates of Q1 and Q4 to $V_{dd}$, data line B is grounded and data line A is set to $V_{dd}$. Current now flows into the data line B through R2 and Q4 to effectively ground the node N2. This cuts off Q2, and node N1 rises to $V_{dd}$. Consequently, Q3 is held on and N2 is maintained at 0 volt. When the address is removed, turning off Q1 and Q4, a "1" has been written into the selected memory cell. The cell operates similarly to read or write a "0".

The 4-transistor cell shown in FIG. 1A typically uses polysilicon (poly) for the resistor loads R1 and R2. The MOS transistors of the 4-transistor cell are traditionally formed by doping the gates using a diffusion technique known as $POCL_3$.

Polysilicon resistors are intrinsic (i.e., undoped) devices. However, the MOS transistor gate is $POCL_3$ doped. Hence, the polysilicon resistors are typically implemented in a second polysilicon layer folded on top of the NMOS transistors. Thus, the 4-transistor cell of the prior art requires more than one polysilicon layer to form the polysilicon resistors. Moreover, the 4-transistor cell having polysilicon resistor loads is particularly sensitive to alpha ($\alpha$) particles affecting the intrinsic resistor material.

SRAM cells having six MOS transistors have been used as an alternative to the 4-transistor cell to avoid the fabrication of resistor R1, R2. As shown in FIG. 1B, the 6-transistor SRAM cell includes four NMOS transistors Q1–Q4, and two transistors Q5 and Q6 operating as load resistors that replace the resistors R1 and R2 of FIG. 1A. The transistors Q5 and Q6 are typically implemented as PMOS transistors.

Four or six transistors used in a SRAM cell result in a relatively large area of the cell. However, to reduce the cost of a SRAM chip, a storage cell area should be reduced. As the area required for a storage cell depends on the number of components used in the cell, it would be desirable to create a SRAM cell with a reduced number of transistor components to reduce the cost of a chip.

DISCLOSURE OF THE INVENTION

Accordingly, one advantage of the invention is in providing a SRAM storage cell having a configuration that allows the storage cell area to be considerably reduced compared to conventional static storage cells.

Another advantage of the invention is in providing a SRAM cell with a reduced number of transistor components.

The above and other advantages of the invention are achieved, at least in part, by providing a memory device that comprises a memory array having a plurality of storage cells for storing data. Random access may be provided to the storage cells for reading and writing data.

Each of the storage cells includes a first MOS transistor of a first conductivity type, and a second MOS transistor of a second conductivity type. Drains of the first and second MOS transistors are respectively coupled to first and second sources of potential. A ground terminal may be used as one of the sources of potential.

The sources, gates and gate back plates of the MOS transistors are commonly connected and coupled to a storage node connectable to bit and word lines for writing and reading data to and from the storage cell.

In accordance with a first aspect of the invention, a switching device may be coupled between the bit and word lines and the storage node. The switching device may comprise a pass MOS transistor of the first conductivity type having a gate coupled to the word line, a drain coupled to the bit line, and a source and a gate back plate coupled to the storage node.

For example, the first MOS transistor may be an N-channel field effect transistor, the second MOS transistor may be a P-channel field-effect transistor, and the pass MOS transistor may be an N-channel field effect transistor.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIGS. 5A–5C illustrate logic 0 writing and reading operations.

FIGS. 6a–6C illustrate logic 1 writing and reading operations.

BEST MODE FOR CARRYING OUT THE INVENTION

The best mode for practicing the invention is based on the realization of a storage cell in a SRAM. However, it is to be understood that the present invention is applicable to any type of memory devices.

Figure 1A:
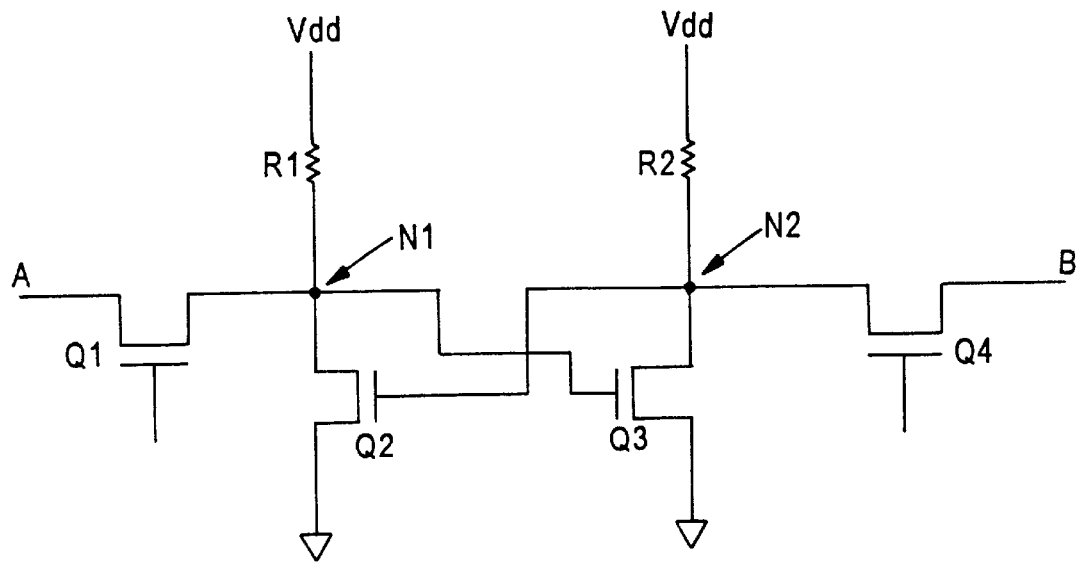
FIGS. 1A and 1B illustrate conventional static storage cells.
Figure 1B:
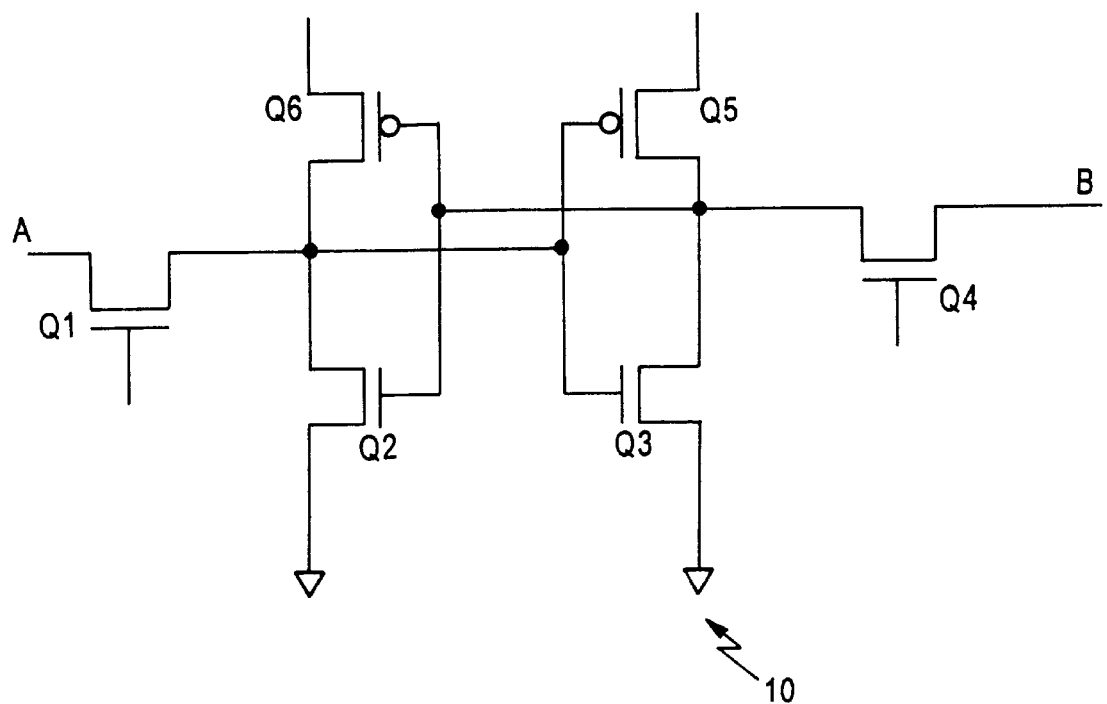
Figure 2:
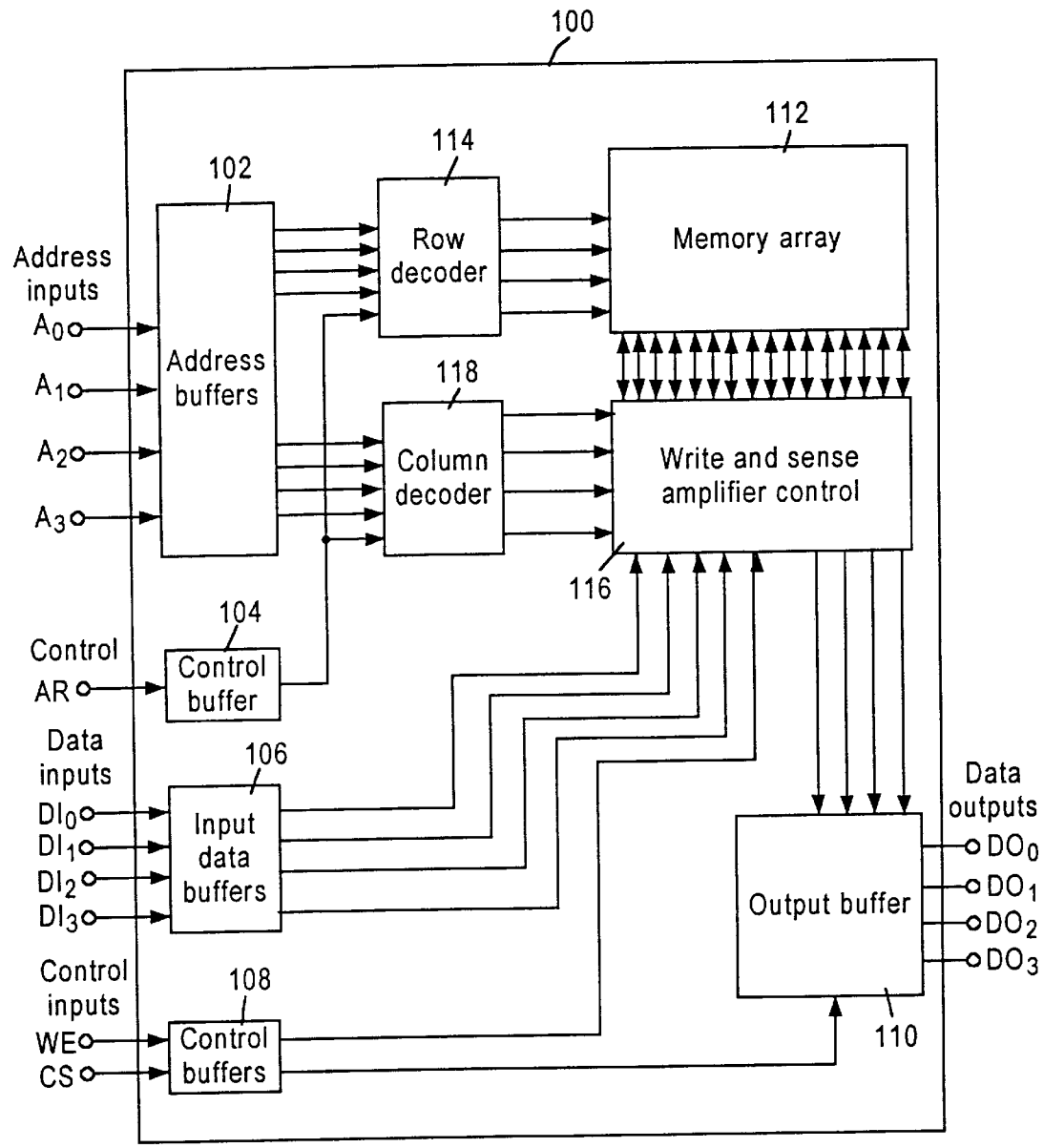
FIG. 2 shows an exemplary SRAM chip.

Referring to FIG. 2, an exemplary SRAM chip 100 may comprise address buffers 102 connected to address inputs $A_0$–$A_3$, a control buffer 104 coupled to an address ready (AR) control input, input data buffers 106 connected to data inputs $DI_0$–$DI_3$, control buffers 108 coupled to write enabling (WE) and chip select (CS) control inputs, and an output buffer 110 coupled to data outputs $DO_0$–$DO_3$.

A memory array 112 is used for storing data within the SRAM 100. The array 112 contains one storage cell per each bit of data that must be stored. The storage cells are arranged in rows and columns.

Figure 3:
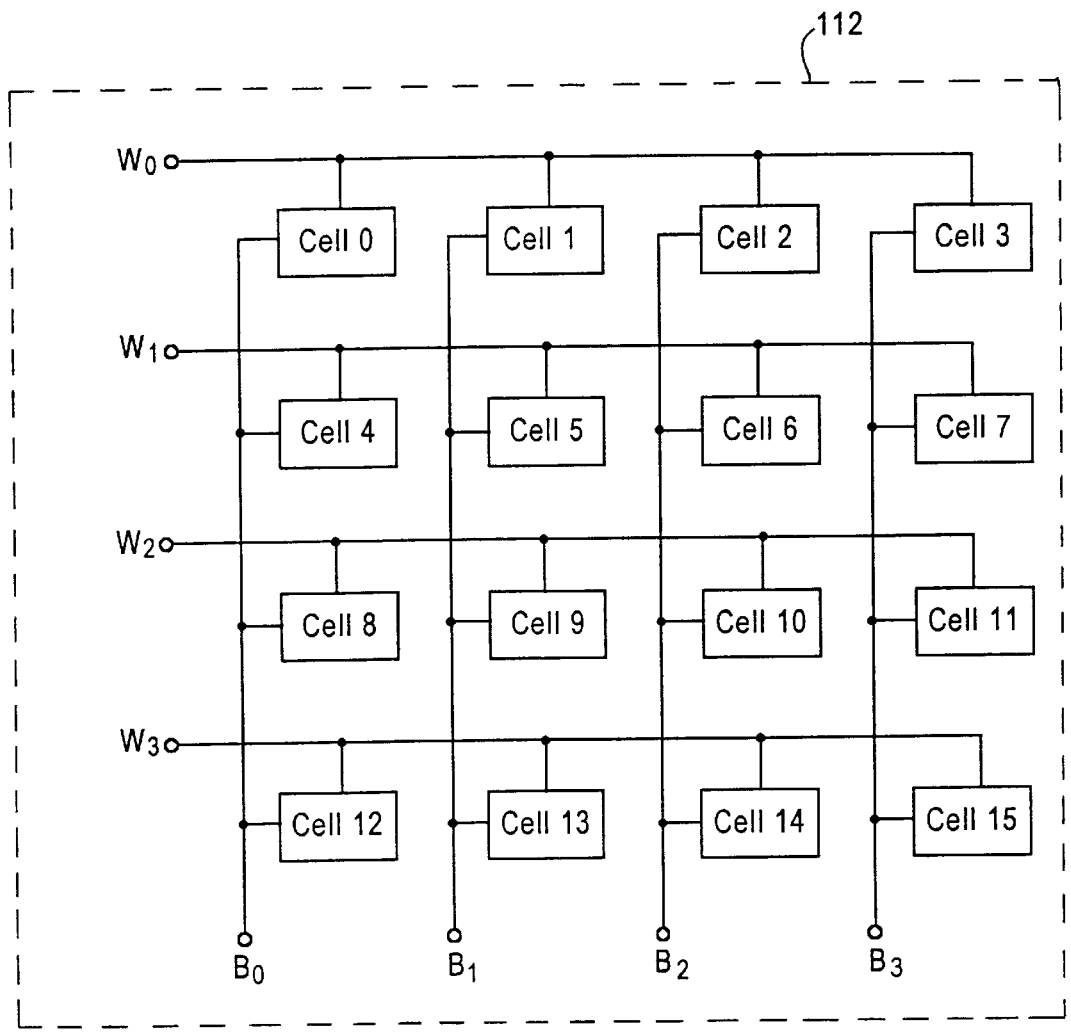
FIG. 3 illustrates a memory array in a SRAM.

For example, FIG. 3 shows the array 112 composed of 16 storage cells arranged 4 rows by 4 columns. The select inputs to the array 112 are row or word lines $W_0$–$W_3$ connected to a row decoder 114. Based on the address inputs to the SRAM 100, the row decoder switches logic levels on one of the word lines to select the corresponding row of the memory array 112.

Data input/output is provided over bit lines $B_0$–$B_3$ coupled to write and sense amplifiers 116. A column decoder 118 selects specific bit lines for data input or output.

Figure 4:
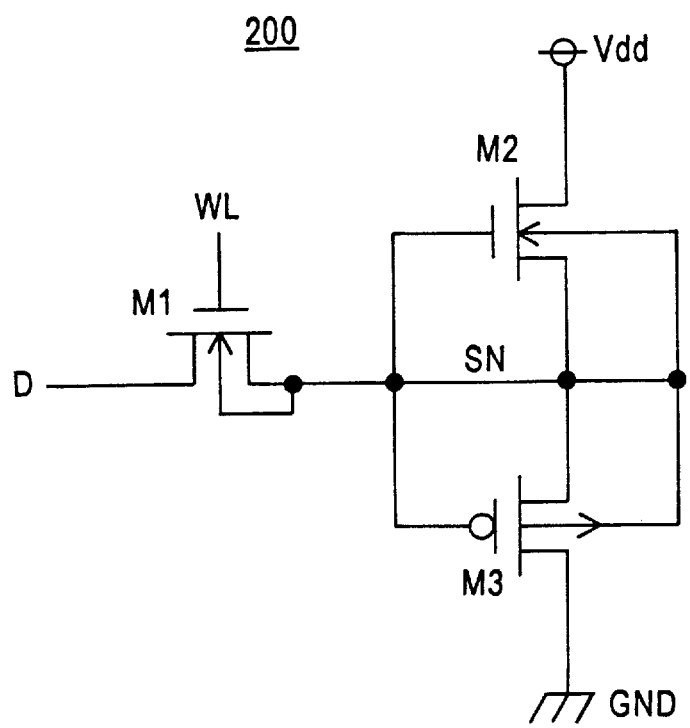
FIG. 4 shows the configuration of a three-transistor storage cell of the present invention.

Reference is now made to FIG. 4 of the drawings showing the configuration of a three-transistor static storage cell 200 in accordance with the present invention. The storage cell 200 may be arranged, for example, in the memory array 112. Input node D of the storage cell 200 may be connected to a bit line, and input node WL may be coupled to a word line.

The storage cell 200 comprises a pass transistor M1, which may be an NMOS transistor having its drain connected to the bit line via the input D. The gate of the transistor M1 is coupled to a word line via the input WL. The source and the gate back plate of the transistor M1 are commonly connected and coupled to a storage node SN of the cell 200.

The storage cell 200 further comprises an NMOS transistor M2 and a PMOS transistor M3 connected between a source of potential $V_{dd}$ and a ground terminal. For example, $V_{dd}$ may be set at 3.3 V.

Sources, gates and gate back plates of the transistors M2 and M3 are commonly connected and coupled to the storage node SN. The drain of the transistor M2 is supplied with potential $V_{dd}$. The drain of the transistor M3 is connected to the ground terminal. The storage cell 200 may be fabricated, for example, using a 3-well CMOS process well known to those skilled in the semiconductor memory art.

Reference is now made to FIGS. 5A–5C, and 6A–6C, illustrating input/output operations of the storage cell 200. In particular, FIGS. 5A, 5B and 5C respectively show potentials at the nodes D, WL and SN during logic 0 writing and reading operations. FIGS. 6A, 6B and 6C respectively depict potentials at the nodes D, WL and SN during logic 1 writing and reading operations.

To write logic 0 into the storage cell 200, the input node D connected to the bit line is set to logic 0 (FIG. 5A, point 1).

Via the input node WL, logic 1 is applied to the gate of the pass transistor M1 (FIG. 5B, point 2). As a result, the pass transistor M1 turns on applying a ground potential to the storage node SN. The ground potential on the SN node causes the PMOS transistor M3 to turn on, and the NMOS transistor M2 to turn off.

When the input node WL is set to logic 0 (FIG. 5B, point 3), the pass transistor M1 turns off disconnecting the input node D from the storage node SN held by the transistor M3 at its threshold voltage $V_{tp}$ (FIG. 5C, point 4). A level of the voltage $V_{tp}$ at the storage node SN corresponds to logic 0 written into the storage cell 200.

To read logic 0 from the storage cell 200, the input node WL is set to logic 1 (FIG. 5B, point 5). The transistor M1 turns on applying the voltage $V_{tp}$ of the storage node SN to the node D. The $V_{tp}$ voltage level supplied from the node D to the bit line (FIG. 5A, point 6) is driven by the transistor M3. The sense amplifier connected to the bit line produces a logic level representing bit 0 held in the storage cell 200.

When the node WL is reset to logic 0 (FIG. 5B, point 7), the transistor M1 turns off disconnecting the input D from the storage node SN to terminate the reading operation. The $V_{tp}$ voltage level representing logic 0 remains at the storage node SN (FIG. 5C, point 8).

To write logic 1 into the storage cell 200, a logic 1 input is applied to the input node D (FIG. 6A, point 1). The node WL is set to logic 1 (FIG. 6B, point 2). As a result, the transistor M1 turns on applying the ($V_{dd}$–$V_{tn}$) voltage level to the storage node SN, where $V_{tn}$ is a threshold voltage of NMOS transistors. The ($V_{dd}$–$V_{tn}$) level at the node SN causes the PMOS transistor M3 to turn off, and the NMOS transistor M2 to turn on.

When the node WL is reset to logic 0 (FIG. 6B, point 3), the transistor M1 turns off disconnecting the input node D from the storage node SN held by the transistor M2 at the voltage equal to $V_{dd}$–$V_{tn}$ (FIG. 6C, point 4). The $V_{dd}$–$V_{tn}$ voltage level corresponds to logic 1 written into the storage cell 200.

To read logic 1 from the storage cell 200, the input node WL is set to logic 1 (FIG. 6B, point 5). The transistor M1 turns on applying the voltage $V_{dd}$–$V_{tn}$ of the storage node SN to the node D. The $V_{dd}$–$V_{tn}$ voltage level supplied from the node D to the bit line (FIG. 6A, point 6) is driven by the transistor M2. The sense amplifier connected to the bit line produces a logic level representing bit 1 held in the storage cell 200.

When the node WL is reset to logic 0 (FIG. 6B, point 7), the transistor M1 turns off disconnecting the input D from the storage node SN. This terminates the reading operation. The $V_{dd}$–$V_{tn}$ voltage level representing logic 1 remains at the storage node SN (FIG. 6C, point 8).

There accordingly has been described a SRAM storage cell that comprises NMOS and PMOS transistors connected with each other between a source of potential and ground. The sources, gates and gate back plates of the transistors are commonly connected and coupled to a storage node. The drain of the NMOS transistor is supplied with the potential, whereas the drain of the PMOS transistor is grounded. This configuration provides considerably reduced area compared to conventional static storage cells.

In this disclosure, there are shown and described only the preferred embodiments of the invention, but it is to be understood that the invention is capable of changes and modifications within the scope of the inventive concept as expressed herein.

What is claimed is:

1. A memory device comprising:
   a memory array having a plurality of storage cells for storing data,
   each of said storage cells being coupled to a bit line and a word line of said memory array and including:
   a storage node,
   a first MOS transistor of a first conductivity type having first drain coupled to a first source of potential, and a source, a first gate and a first gate back plate coupled storage node, and
   a second MOS transistor of a second conductivity type having a drain coupled to a second source of potential, and a second source, a second gate and a second gate back plate coupled to said storage node.

2. The memory device of claim 1, further comprising a switching device coupled between said bit line and said storage node and controlled via said word line.

3. The memory device of claim 2, wherein said switching device comprises a pass MOS transistor of said first conductivity type having a gate coupled to said word line, a drain coupled to said bit line, and a source and a gate back plate coupled to said storage node.

4. The memory device of claim 1, wherein said memory array provide random access to said storage cells for reading and writing the data.

5. The memory device of claim 3, wherein said first MOS transistor is an N-channel field effect transistor, and said second MOS transistor is a P-channel field-effect transistor.

6. The memory device of claim 5, wherein said pass MOS transistor is an N-channel field effect transistor.

7. A static random-access storage cell coupled to a word line and a bit line, comprising:

a storage node, a first MOSFET device of a first conductivity type having an electrode coupled to a first source of potential, and a gate coupled to said storage node, and a second MOSFET device of a second conductivity type having an electrode coupled to a second source of potential, and a gate coupled to said storage node.

8. The cell of claim 7, further comprising a pass MOSFET device of a first conductivity type having a first electrode coupled to said bit line, a gate coupled to said word line, and a second electrode coupled to said storage node.

9. The cell of claim 8, wherein said first MOSFET device is an NMOS transistor having a drain coupled to said first source of potential, and a gate and a source coupled to said storage node.

10. The cell of claim 9, wherein said second MOSFET device is a PMOS transistor having a drain coupled to a ground terminal, and a gate and a source coupled to said storage node.

11. The cell of claim 10, wherein said pass MOSFET is an NMOS transistor having a drain coupled to said bit line, a gate coupled to said word line, and a source coupled to said storage node.

12. The cell of claim 11, wherein each of said first, second and pass MOSFET devices has a gate back plate coupled to said storage node.

\* \* \* \* \*